(12) United States Patent
Uneme

(10) Patent No.: US 10,798,855 B2
(45) Date of Patent: Oct. 6, 2020

(54) POWER CONVERSION DEVICE

(71) Applicant: HONDA MOTOR CO., LTD., Minato-ku, Tokyo (JP)

(72) Inventor: Takahiro Uneme, Wako (JP)

(73) Assignee: HONDA MOTOR CO., LTD., Tokyo (JP)

(*) Notice: Subject to any disclaimer, the term of this patent is extended or adjusted under 35 U.S.C. 154(b) by 52 days.

(21) Appl. No.: 16/162,444

(22) Filed: Oct. 17, 2018

(65) Prior Publication Data
US 2019/0122958 A1    Apr. 25, 2019

(30) Foreign Application Priority Data
Oct. 19, 2017  (JP) ................. 2017-202664

(51) Int. Cl.
H05K 7/20 (2006.01)
H01L 23/473 (2006.01)

(52) U.S. Cl.
CPC ....... *H05K 7/20927* (2013.01); *H01L 23/473* (2013.01); *H05K 7/20254* (2013.01); *H05K 7/20872* (2013.01)

(58) Field of Classification Search
CPC .......... H05K 7/20927; H05K 7/20872; H05K 7/20254; H01L 23/473
See application file for complete search history.

(56) References Cited

U.S. PATENT DOCUMENTS 8,933,557 B2 * 1/2015 Gohara ............... H01L 23/3735
                                                      165/168
9,980,415 B2 * 5/2018 Zhou .................. H05K 7/20927
10,214,109 B2 * 2/2019 Gohara ................. H01L 23/473
(Continued)

FOREIGN PATENT DOCUMENTS

CN    102549743    7/2012
CN    105409105    3/2016
CN    107181417    9/2017
(Continued)

OTHER PUBLICATIONS

Japanese Office Action for Japanese Patent Application No. 2017-202664 dated Feb. 26, 2019.
(Continued)

*Primary Examiner* — Zachary Pape
(74) *Attorney, Agent, or Firm* — Amin, Turocy & Watson, LLP

(57) ABSTRACT

A refrigerant flow channel includes a first flow channel extending in a first direction and a plurality of first branching flow channels extending in a second direction by branching from the first flow channel. Three element arrays corresponding to a first motor for driving and three element arrays corresponding to a second motor for power generation are respectively disposed side by side in the first direction on a mounting surface. The element array of the first motor in each phase and the element array of the second motor in each phase face each other in the second direction, and are disposed at positions overlapping the first branching flow channel in a plan view. The element array of the first motor is located on an upstream side of the first branching flow channel with respect to the element array of the second motor.

6 Claims, 6 Drawing Sheets

(56) References Cited

U.S. PATENT DOCUMENTS

2006/0086981 A1    4/2006  Yamaguchi et al.

FOREIGN PATENT DOCUMENTS

| | | |
|---|---|---|
| JP | 2005-332863 | 12/2005 |
| JP | 2012-228038 | 11/2012 |
| JP | 2015-079819 | 4/2015 |
| JP | 2015-082950 | 4/2015 |
| WO | 2007/064020 | 6/2007 |

OTHER PUBLICATIONS

Chinese Office Action for Chinese Patent Application No. 201811207416.5 dated May 8, 2020.

\* cited by examiner

POWER CONVERSION DEVICE

CROSS-REFERENCE TO RELATED APPLICATION

Priority is claimed on Japanese Patent Application No. 2017-202664, filed Oct. 19, 2017, the content of which is incorporated herein by reference.

BACKGROUND OF THE INVENTION

Field of the Invention

The present invention relates to a power conversion device.

Description of Related Art

Hitherto, as shown in FIG. 7, there has been known a semiconductor device 110 including a circuit element portion 101 constituted by a plurality of semiconductor elements, a circuit substrate 102 on which a plurality of circuit element portions 101 are mounted, and a cooler 103 which is connected to the circuit substrate 102 (see, for example, Japanese Unexamined Patent Application, First Publication No. 2015-079819). A refrigerant flow channel 111 is formed in the cooler 103 along a longitudinal direction (array direction of the circuit element portion 101). The circuit element portion 101 is cooled by heat exchange between a refrigerant flowing through the refrigerant flow channel 111 and the circuit element portion.

SUMMARY OF THE INVENTION

In the semiconductor device 110 according to the above related art, a refrigerant cooling a circuit element portion 101 on a side (that is, upstream side) close to an inlet 112 of the refrigerant flow channel 111 cools a circuit element portion 101 on a side (that is, downstream side) close to an outlet 113 of the refrigerant flow channel 111. Therefore, in a case where the number of circuit element portions 101 arrayed along the refrigerant flow channel 111 increases, the temperature gradient of a refrigerant becomes larger between the upstream side and the downstream side of the refrigerant flow channel 111, and thus there is the possibility of an increase in the change of cooling performance caused by the array positions of the circuit element portions 101. In a case where the temperature gradient of a refrigerant increases between the upstream side and the downstream side of the refrigerant flow channel 111, it becomes difficult to cool the circuit element portions 101 from the upstream side of the refrigerant flow channel 111 toward the downstream side thereof. As a result, it becomes difficult to uniformly cool each of the circuit element portions 101.

In addition, in a case where a plurality of circuit element portions 101 configure an electrification switching circuit for a motor of a plurality of phases, the arraying of circuit element portions 101 having different phases along the refrigerant flow channel 111 causes a change in cooling performance among a plurality of phases of one motor. As a result, it becomes difficult to uniformly cool the circuit element portions 101 of each phase.

An aspect of the present invention is contrived in view of such circumstances, and an object thereof is to provide a power conversion device which makes it possible to cool a plurality of elements uniformly and efficiently, and to suppress an increase in a difference in cooling performance between the plurality of elements.

In order to solve the above problem and achieve such an object, the present invention adopts the following aspects.

(1) According to an aspect of the present invention, there is provided a power conversion device including: a heat dissipation portion having a refrigerant flow channel through which a refrigerant circulates and a mounting surface; a plurality of first element arrays in which element arrays including a high side arm element and a low side arm element delivering power to and from a first motor capable of a power-running operation using power supplied from a power storage device are disposed side by side in a first direction on the mounting surface according to a plurality of phases of the first motor; and a plurality of second element arrays in which element arrays including a high side arm element and a low side arm element delivering power to and from a second motor capable of generating power for running of the first motor are disposed side by side in the first direction on the mounting surface according to a plurality of phases of the second motor, wherein the plurality of first element arrays and the plurality of second element arrays are disposed at positions facing each other in a second direction intersecting the first direction, the refrigerant flow channel includes a first flow channel extending in the first direction, and a plurality of first branching flow channels that branch from the first flow channel so as to correspond to each phase of the plurality of first element arrays and the plurality of second element arrays, and extend in the second direction at positions overlapping the first element arrays and the second element arrays in a plan view seen from a third direction orthogonal to the first direction and the second direction, and in each of the first branching flow channels, the plurality of first element arrays are located on an upstream side of the first branching flow channel in the second direction with respect to the plurality of second element arrays.

(2) In the above (1), the high side arm element and the low side arm element in the plurality of first element arrays and the plurality of second element arrays may be disposed side by side in the first direction.

(3) In the above (1) or (2), the power conversion device may further include a voltage converter which is electrically connected to the plurality of first element arrays or the plurality of second element arrays, a high side arm element and a low side arm element configuring the voltage converter may be disposed side by side in the second direction on the mounting surface, the refrigerant flow channel may further include a second branching flow channel that branches from the first flow channel, and extends in the second direction at a position overlapping the high side arm element and the low side arm element of the voltage converter in the plan view, and the low side arm element of the voltage converter may be located on an upstream side of the second branching flow channel in the second direction with respect to the high side arm element of the voltage converter.

According to the above (1), as compared with a case where a plurality of power conversion circuit portions are disposed on a refrigerant flow channel of one system, it is possible to suppress an increase in the temperature gradient of a refrigerant between the upstream side and the downstream side of the refrigerant flow channel associated with an increase in the number of power conversion circuit portions. In addition, since a branching flow channel is provided for each phase in the first motor and the second motor, it is possible to suppress a change in cooling performance among a plurality of phases of each motor, and to make cooling performance between a plurality of phases uniform.

Here, the first element array corresponding to the first motor has more of a tendency to generate heat than the second element array corresponding to the second motor. Therefore, in each of the first branching flow channels, the first element array is disposed further upstream than the second element array, and thus a difference in temperature between the refrigerant and the first element array has a tendency to be secured. Thereby, it is possible to uniformly and efficiently cool the first element array and the second element array, and to suppress an increase in a difference in cooling performance between a plurality of element arrays.

In a case of the above (2), in each of the first element array and the second element array in each branching flow channel, the high side arm element and the low side arm element are disposed side by side in the first direction, and thus it is possible to suppress an increase in a difference in cooling performance between the high side arm element and the low side arm element.

In a case of the above (3), in a case where a voltage conversion circuit boosts a voltage from the power source side to a plurality of first element arrays, heat generation due to switching of the low side arm element becomes larger than that of the high side arm element. In addition, in a case where the voltage conversion circuit steps down a voltage from a plurality of second element arrays to the power source side, heat generation due to switching of the high side arm element becomes larger than that of the low side arm element. However, in a case where the output current of the power source is larger than the input current thereof when voltage boost and voltage step down are compared with each other, heat generation of the low side arm element becomes larger than that of the high side arm element.

In the second branching flow channel, since the low side arm element is disposed on the upstream side of the high side arm element, it is possible to secure a difference in temperature between the refrigerant and the low side arm element. As a result, it is possible to efficiently cool the low side arm element. Thereby, it is possible to uniformly and efficiently cool the high side arm element and the low side arm element of the voltage conversion circuit, and to suppress an increase in a difference in cooling performance between the high side arm element and the low side arm element.

DETAILED DESCRIPTION OF THE INVENTION

Hereinafter, an embodiment of a power conversion device of the present invention will be described with reference to the accompanying drawings.

The power conversion device according to the present embodiment controls power deliver between a motor and a battery. For example, the power conversion device is mounted in an electromotive vehicle or the like. The electromotive vehicle is an electric automobile, a hybrid vehicle, a fuel cell vehicle, or the like. The electric automobile is driven using a battery as a motive power source. The hybrid vehicle is driven using a battery and an internal-combustion engine as a motive power source. The fuel cell vehicle is driven using a fuel cell as a driving source.

Figure 1:
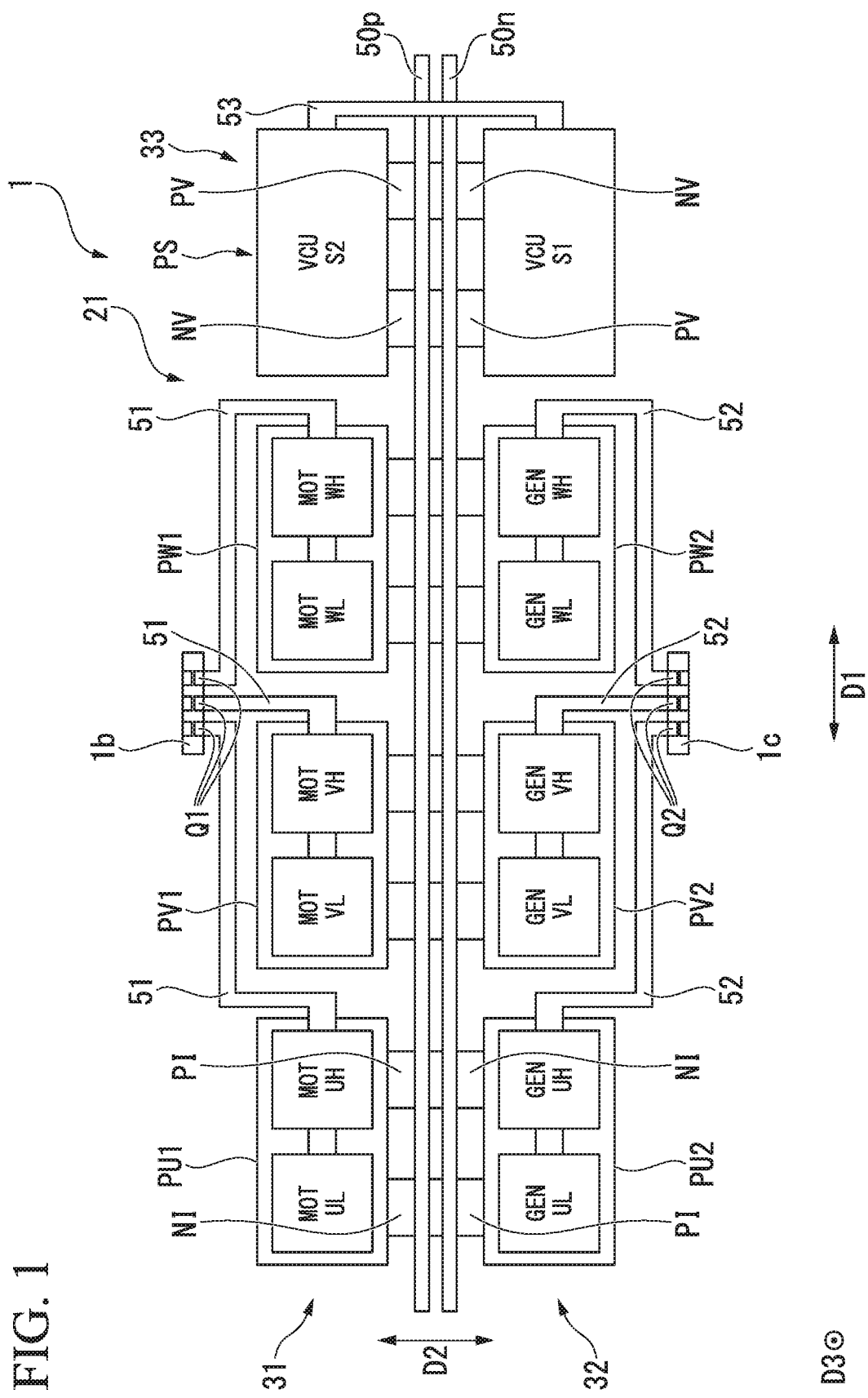
FIG. 1 is a plan view schematically illustrating a configuration of a power conversion device according to an embodiment of the present invention.

FIG. 1 is a plan view schematically illustrating a configuration of a power conversion device 1 according to an embodiment of the present invention.

Figure 2:
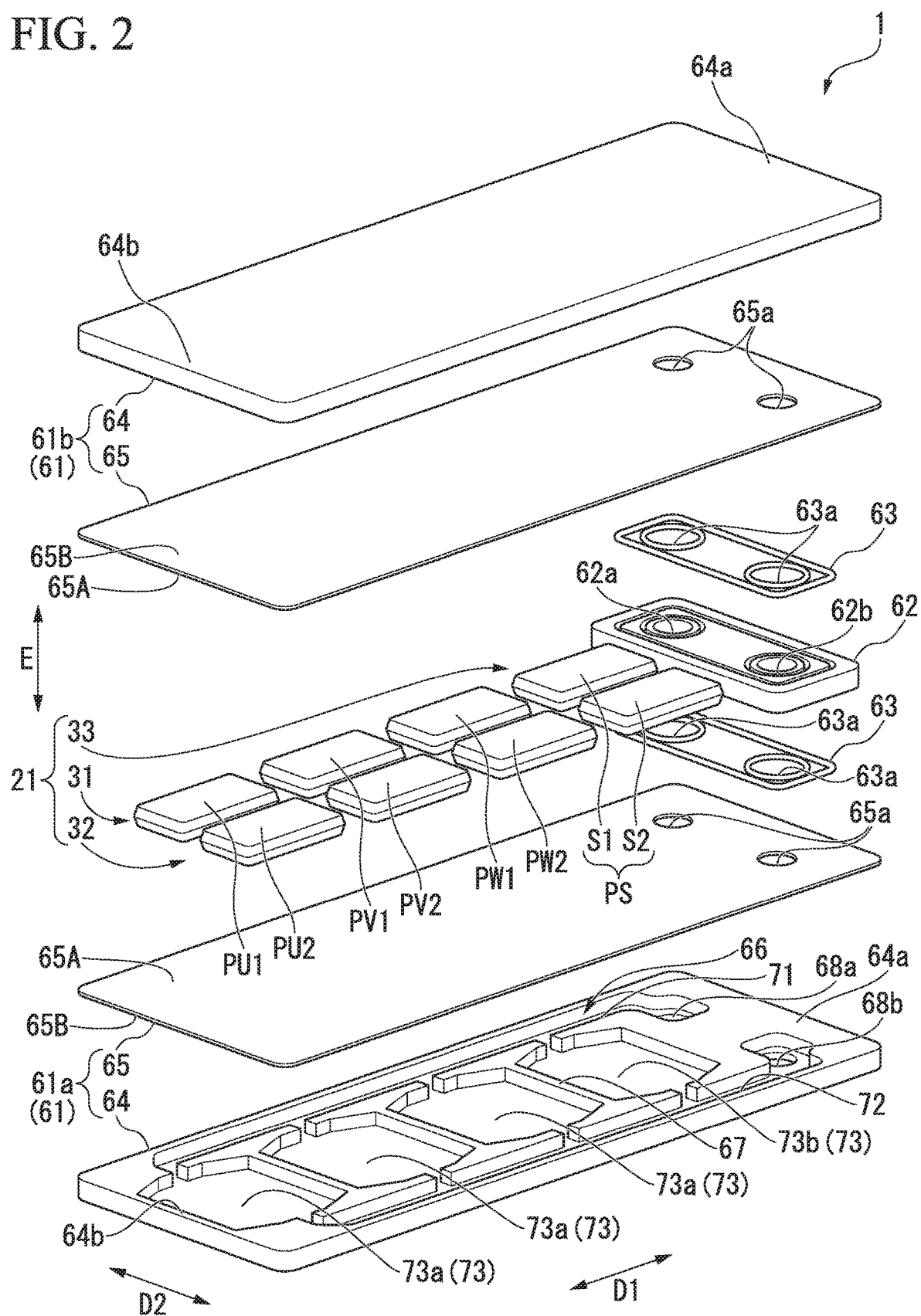
FIG. 2 is an exploded perspective view schematically illustrating a configuration of the power conversion device according to the embodiment of the present invention.
Figure 3:
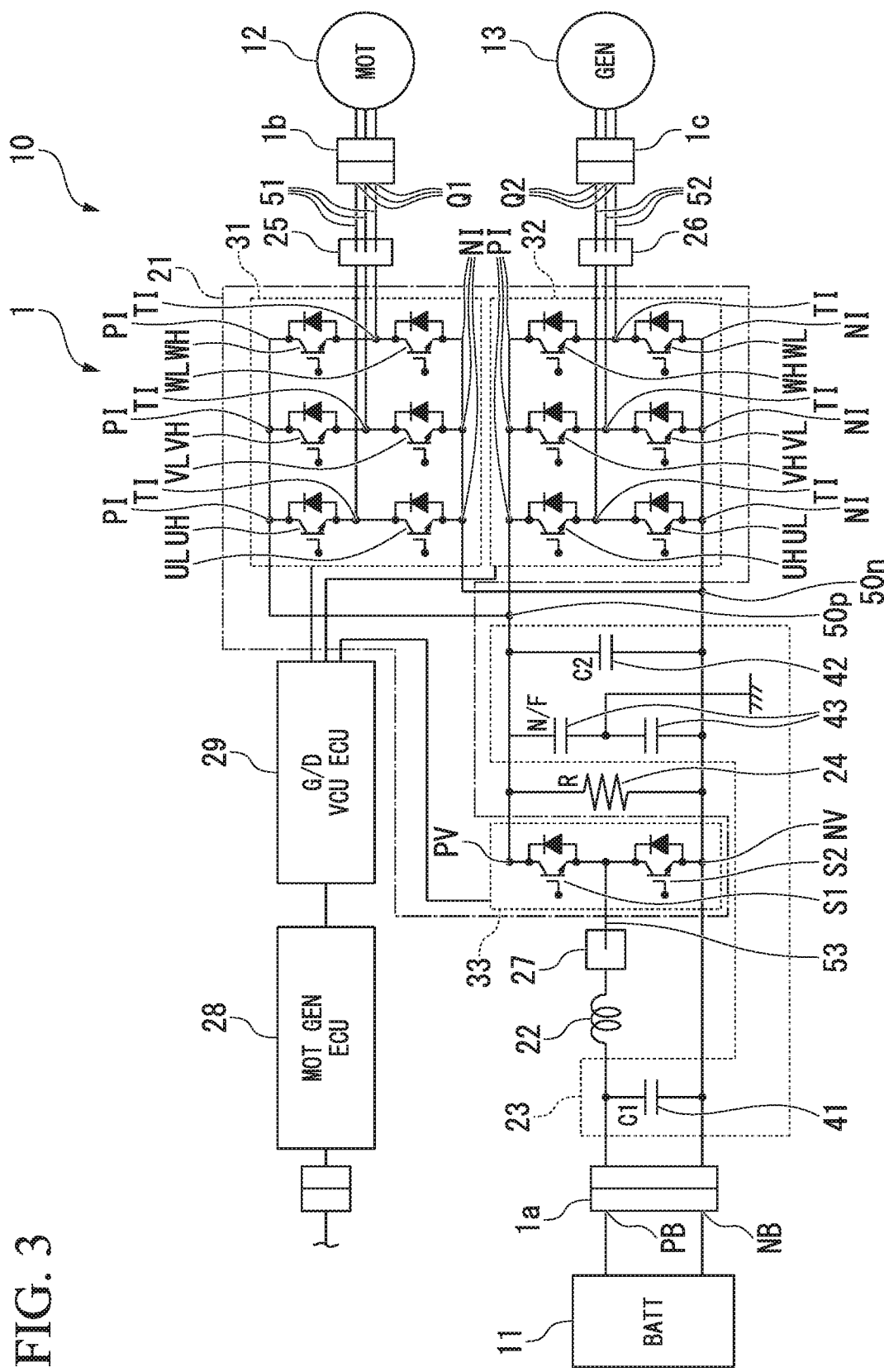
FIG. 3 is a diagram illustrating a configuration of a portion of a vehicle in which the power conversion device according to the embodiment of the present invention is mounted.
Figure 4:
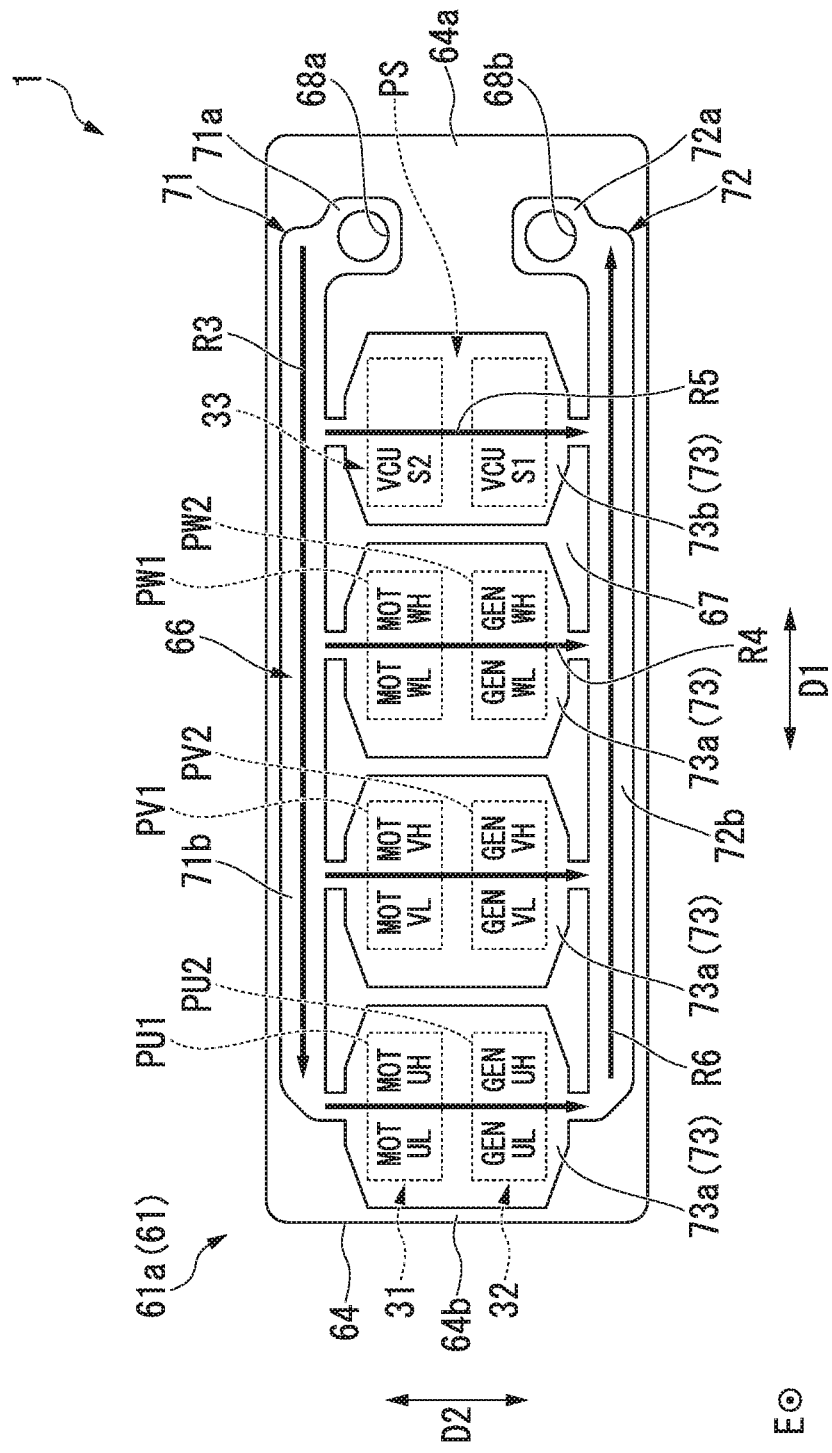
FIG. 4 is a plan view schematically illustrating a heat dissipation case of a first heat dissipation portion and a plurality of element arrays of a power module in the power conversion device according to the embodiment of the present invention.

FIG. 2 is an exploded perspective view schematically illustrating a configuration of a power conversion device 1 according to an embodiment of the present invention. FIG. 3 is a diagram illustrating a configuration of a portion of a vehicle 10 in which the power conversion device 1 according to an embodiment of the present invention is mounted. FIG. 4 is a plan view schematically illustrating a heat dissipation case 64 of a first heat dissipation portion 61a and a plurality of element arrays PU1, PV1, PW1, PU2, PV2, and PW2 of a power module 21 in the power conversion device 1 according to the embodiment of the present invention.

<Vehicle>

As shown in FIG. 3, the vehicle 10 includes a battery 11 (BATT), a first motor 12 (MOT) for traveling driving, and a second motor 13 (GEN) for power generation, in addition to the power conversion device 1.

The battery 11 includes a battery case and a plurality of battery modules received within the battery case. The battery module includes a plurality of battery cells connected in series to each other. The battery 11 includes a positive electrode terminal PB and a negative electrode terminal NB which are connected to a direct-current connector 1a of the power conversion device 1. The positive electrode terminal PB and the negative electrode terminal NB are connected to a positive electrode end and a negative electrode end of the plurality of battery modules connected in series to each other within the battery case.

The first motor 12 generates a rotary driving force (power-running operation) using power which is supplied from the battery 11. The second motor 13 generates generating power using a rotary driving force which is input to a rotary shaft. Here, the second motor 13 is configured to have the rotary dynamic force of an internal-combustion engine transmitted thereto. For example, each of the first motor 12 and the second motor 13 is a three-phase AC brushless DC motor. Three phases are a U-phase, a V-phase, and a W-phase. Each of the first motor 12 and the second motor 13 is an inner rotor type. Each of the motors 12 and 13 includes a rotor having a field permanent magnet and a stator having a three-phase stator winding for generating a rotating magnetic field that rotates the rotor. The three-phase stator winding of the first motor 12 is connected to a first three-phase connector 1b of the power conversion device 1. The three-phase stator winding of the second motor 13 is connected to a second three-phase connector 1c of the power conversion device 1.

<Power Conversion Device>

The power conversion device 1 includes a power module 21, a reactor 22, a capacitor unit 23, a resistor 24, a first current sensor 25, a second current sensor 26, a third current sensor 27, an electronic control unit 28 (MOT GEN ECU), and a gate drive unit 29 (G/D VCU ECU).

The power module 21 includes a first power conversion circuit portion 31, a second power conversion circuit portion 32, and a third power conversion circuit portion 33. The first power conversion circuit portion 31 is connected to the three-phase stator winding of the first motor 12 by the first three-phase connector 1b. The first power conversion circuit portion 31 converts direct-current power which is input from the battery 11 through the third power conversion circuit portion 33 into three-phase AC power. The second power conversion circuit portion 32 is connected to the three-phase stator winding of the second motor 13 by the second three-phase connector 1c. The second power conversion circuit portion 32 converts three-phase AC power which is input from the second motor 13 into direct-current power. The direct-current power converted by the second power conversion circuit portion 32 can be supplied to at least one of the battery 11 and the first power conversion circuit portion 31.

Each of the first power conversion circuit portion 31 and the second power conversion circuit portion 32 includes a bridge circuit formed by a plurality of switching elements which are bridge-connected to each other. For example, the switching element is a transistor such as an insulated gate bipolar transistor (IGBT) or a metal oxide semi-conductor field effect transistor (MOSFET). For example, in the bridge circuit, high side arm and low side arm U-phase transistors UH and UL forming a pair, high side arm and low side arm V-phase transistors VH and VL forming a pair, and high side arm and low side arm W-phase transistors WH and WL forming a pair are bridge-connected to each other. In the present embodiment, in each of the U, V, and W-phases, high side arm and low side arm transistors (for example, U-phase high side arm transistor UH and U-phase low side arm transistor UL) are disposed next to each other in a first direction D1.

Each of the transistors UH, VH, and WH of a high side arm configures a high side arm by its collector being connected to a positive electrode terminal PI. In each phase, each positive electrode terminal PI of a high side arm is connected to a positive electrode bus bar 50p.

Each of the transistors UL, VL, and WL of a low side arm configures a low side arm by its emitter being connected to a negative electrode terminal NI. In each phase, each negative electrode terminal NI of a low side arm is connected to a negative electrode bus bar 50n.

As shown in FIGS. 1 and 3, the emitter of each of the transistors UH, VH, and WH of a high side arm in each phase is connected to the collector of each of the transistors UL, VL, and WL of a low side arm at a connection point TI.

The connection point TI of the first power conversion circuit portion 31 in each phase is connected to a first input and output terminal Q1 by a first bus bar 51. The first input and output terminal Q1 is connected to the first three-phase connector 1b. The connection point TI of the first power conversion circuit portion 31 in each phase is connected to the stator winding of the first motor 12 in each phase through the first bus bar 51, the first input and output terminal Q1, and the first three-phase connector 1b.

The connection point TI of the second power conversion circuit portion 32 in each phase is connected to a second input and output terminal Q2 by a second bus bar 52. The second input and output terminal Q2 is connected to the second three-phase connector 1c. The connection point TI of the second power conversion circuit portion 32 in each phase is connected to the stator winding of the second motor 13 in each phase through the second bus bar 52, the second input and output terminal Q2, and the second three-phase connector 1c. The bridge circuit includes a diode which is connected between the collector and the emitter of each of the transistors UH, UL, VH, VL, WH, and WL so as to have a forward direction from the emitter toward the collector.

Each of the first power conversion circuit portion 31 and the second power conversion circuit portion 32 switches between the on-state (electrical conduction)/off-state (cut-off) of a transistor pair in each phase, on the basis of a gate signal that is a switching command which is input from the gate drive unit 29 to the gate of each of the transistors UH, VH, WH, UL, VL, and WL. The first power conversion circuit portion 31 converts direct-current power which is input from the battery 11 through the third power conversion circuit portion 33 into three-phase AC power, and sequentially commutates electrical conduction to the three-phase stator winding of the first motor 12, to thereby allow for electrical conduction of an AC U-phase current, a V-phase current, and a W-phase current to the three-phase stator winding. The second power conversion circuit portion 32 converts three-phase AC power which is output from the three-phase stator winding of the second motor 13 into direct-current power by on (electrical conduction)/off (cut-off) driving of a transistor pair in each phase synchronized with the rotation of the second motor 13.

The third power conversion circuit portion 33 is a voltage control unit (VCU). The third power conversion circuit portion 33 includes switching elements of a high side arm and a low side arm forming a pair. For example, the third power conversion circuit portion 33 includes a first transistor S1 of a high side arm and a second transistor S2 of a low side arm. The first transistor S1 configures a high side arm by its collector being connected to a positive electrode terminal PV. The positive electrode terminal PV of a high side arm is connected to the positive electrode bus bar 50p. The second transistor S2 configures a low side arm by its emitter being connected to a negative electrode terminal NV. The negative electrode terminal NV of a low side arm is connected to the negative electrode bus bar 50n. The emitter of the first transistor S1 of a high side arm is connected to the collector of the second transistor S2 of a low side arm. The third power conversion circuit portion 33 includes a diode which is connected between the collector and the emitter of each of the first transistor S1 and the second transistor S2 so as to have a forward direction from the emitter toward the collector.

A connection point between the first transistor S1 of a high side arm and the second transistor S2 of a low side arm is connected to the reactor 22 by a third bus bar 53. Both ends of the reactor 22 are connected to the connection point between the first transistor S1 and the second transistor S2, and the positive electrode terminal PB of the battery 11. The reactor 22 includes a coil and a temperature sensor that detects the temperature of the coil. The temperature sensor is connected to the electronic control unit 28 by a signal line.

The third power conversion circuit portion 33 switches between the on-state (electrical conduction)/off-state (cutoff) of a transistor pair on the basis of a gate signal that is a switching command which is input from the gate drive unit 29 to the gate of each of the first transistor S1 and the second transistor S2.

The third power conversion circuit portion 33 alternately switches between, during a boost in voltage, a first state where the second transistor S2 is set to be in an on-state (electrical conduction) and the first transistor S1 is set to be in an off-state (cutoff), and a second state where the second transistor S2 is set to be in an off-state (cutoff) and the first transistor S1 is set to be in an on-state (electrical conduction). In the first state, sequentially, a current flows to the positive electrode terminal PB of the battery 11, the reactor 22, the second transistor S2, and the negative electrode terminal NB of the battery 11, the reactor 22 is DC excited, and magnetic energy is accumulated. In the second state, an electromotive voltage (induced voltage) is generated between both ends of the reactor 22 so as to prevent a change in magnetic flux due to a current flowing to the reactor 22 being cut off. An induced voltage caused by the magnetic energy accumulated in the reactor 22 is superimposed on a battery voltage, and thus a boost voltage higher than a voltage between the terminals of the battery 11 is applied between the positive electrode terminal PV and the negative electrode terminal NV of the third power conversion circuit portion 33.

The third power conversion circuit portion 33 alternately switches between the second state and the first state during regeneration. In the second state, sequentially, a current flows to the positive electrode terminal PV of the third power conversion circuit portion 33, the first transistor S1, the reactor 22, and the positive electrode terminal PB of the battery 11, the reactor 22 is DC excited, and magnetic energy is accumulated. In the first state, an electromotive voltage (induced voltage) is generated between both ends of the reactor 22 so as to prevent a change in magnetic flux due to a current flowing to reactor 22 being cut off. An induced voltage caused by the magnetic energy accumulated in the reactor 22 is stepped down, and thus a stepped down voltage lower than a voltage between the positive electrode terminal PV and the negative electrode terminal NV of the third power conversion circuit portion 33 is applied between the positive electrode terminal PB and the negative electrode terminal NB of the battery 11.

The capacitor unit 23 includes a first smoothing capacitor 41, a second smoothing capacitor 42, and a noise filter 43.

The first smoothing capacitor 41 is connected between the positive electrode terminal PB and the negative electrode terminal NB of the battery 11. The first smoothing capacitor 41 smoothes a voltage fluctuation which is generated with the on/off switching operations of the first transistor S1 and the second transistor S2 during the regeneration of the third power conversion circuit portion 33.

The second smoothing capacitor 42 is connected between the positive electrode terminal PI and the negative electrode terminal NI of each of the first power conversion circuit portion 31 and the second power conversion circuit portion 32, and between the positive electrode terminal PV and the negative electrode terminal NV of the third power conversion circuit portion 33. The second smoothing capacitor 42 is connected to a plurality of positive electrode terminal PI and negative electrode terminals NI, and the positive electrode terminal PV and the negative electrode terminal NV through the positive electrode bus bar 50p and the negative electrode bus bar 50n. The second smoothing capacitor 42 smoothes a voltage fluctuation which is generated with the on/off switching operation of each of the transistors UH, UL, VH, VL, WH, and WL of each of the first power conversion circuit portion 31 and the second power conversion circuit portion 32. The second smoothing capacitor 42 smoothes a voltage fluctuation which is generated with the on/off switching operations of the first transistor S1 and the second transistor S2 during a boost in voltage of the third power conversion circuit portion 33.

The noise filter 43 is connected between the positive electrode terminal PI and the negative electrode terminal NI of each of the first power conversion circuit portion 31 and the second power conversion circuit portion 32, and between the positive electrode terminal PV and the negative electrode terminal NV of the third power conversion circuit portion 33. The noise filter 43 includes two capacitors which are connected in series to each other. A connection point between the two capacitors is connected to the body ground or the like of the vehicle 10.

The resistor 24 is connected between the positive electrode terminal PI and the negative electrode terminal NI of each of the first power conversion circuit portion 31 and the second power conversion circuit portion 32, and between the positive electrode terminal PV and the negative electrode terminal NV of the third power conversion circuit portion 33.

The first current sensor 25 is disposed at the first bus bar 51 that connects the connection point TI of the first power conversion circuit portion 31 in each phase and the first input and output terminal Q1, and detects a current of each of the U-phase, the V-phase, and the W-phase. The second current sensor 26 is disposed at the second bus bar 52 that connects the connection point TI of the second power conversion circuit portion 32 in each phase and the second input and output terminal Q2, and detects a current of each of the U-phase, the V-phase, and the W-phase. The third current sensor 27 is disposed at the third bus bar 53 that connects the connection point between the first transistor S1 and the second transistor S2 and the reactor 22, and detects a current flowing to the reactor 22.

Each of the first current sensor 25, the second current sensor 26, and the third current sensor 27 is connected to the electronic control unit 28 by a signal line.

The electronic control unit 28 controls an operation of each of the first motor 12 and the second motor 13. For example, the electronic control unit 28 is a software functional unit that functions by a predetermined program being executed by a processor such as a central processing unit (CPU). The software functional unit is an electronic control unit (ECU) including a processor such as a CPU, a read only memory (ROM) that stores a program, a random access memory (RAM) that temporarily stores data, and an electronic circuit such as a timer. Meanwhile, at least a portion of the electronic control unit 28 may be an integrated circuit such as a large scale integration (LSI). For example, the electronic control unit 28 executes feedback control or the like of a current using a current detection value of the first current sensor 25 and a current target value according to a torque command value for the first motor 12, and generates a control signal which is input to the gate drive unit 29. For example, the electronic control unit 28 executes feedback control or the like of a current using a current detection value of the second current sensor 26 and a current target value according to a regeneration command value for the second motor 13, and generates a control signal which is input to the gate drive unit 29. The control signal is a signal indicating a timing at which on (electrical conduction)/off (cutoff) driving is performed on each of the transistors UH, VH, WH, UL, VL, and WL of each of the first power conversion circuit portion 31 and the second power conversion circuit portion 32. For example, the control signal is a pulse-width modulated signal or the like.

The gate drive unit 29 generates a gate signal for performing actual on (electrical conduction)/off (cutoff) driving on each of the transistors UH, VH, WH, UL, VL, and WL of each of the first power conversion circuit portion 31 and the second power conversion circuit portion 32, on the basis of the control signal which is received from the electronic control unit 28. For example, the gate drive unit 29 executes the amplification, level shift and the like of the control signal, and generates a gate signal.

The gate drive unit 29 generates a gate signal for performing on (electrical conduction)/off (cutoff) driving on each of the first transistor S1 and the second transistor S2 of the third power conversion circuit portion 33. For example, the gate drive unit 29 generates a gate signal having a duty ratio according to a boost voltage command during a boost in voltage of the third power conversion circuit portion 33 or a step down voltage command during the regeneration of the third power conversion circuit portion 33. The duty ratio is a ratio between the first transistor S1 and the second transistor S2.

As shown in FIGS. 1, 2 and 4, in each of the first power conversion circuit portion 31 and the second power conversion circuit portion 32 of the power module 21, a high side arm switching element and a low side arm switching element corresponding to each of the three phases form element arrays PU1, PV1, PW1, PU2, PV2, and PW2. In each of the first power conversion circuit portion 31 and the second power conversion circuit portion 32, three element arrays PU1, PV1, and PW1 and three element arrays PU2, PV2, and PW2 corresponding to the three phases are respectively disposed side by side in the first direction D1. For example, in the first power conversion circuit portion 31, the element array PU1 of the high side arm and low side arm U-phase transistors UH and UL, the element array PV1 of the high side arm and low side arm V-phase transistors VH and VL, and the element array PW1 of the high side arm and low side arm W-phase transistors WH and WL are sequentially disposed side by side in the first direction D1.

For example, in the second power conversion circuit portion 32, the element array PU2 of the high side arm and low side arm U-phase transistors UH and UL, the element array PV2 of the high side arm and low side arm V-phase transistors VH and VL, and the element array PW2 of the high side arm and low side arm W-phase transistors WH and WL are sequentially disposed side by side in the first direction D1.

In each of the first power conversion circuit portion 31 and the second power conversion circuit portion 32, a high side arm switching element and a low side arm switching element in the element arrays PU1, PV1, PW1, PU2, PV2, and PW2 corresponding to each of the three phases are disposed side by side in the first direction D1. In each of the high side arm and low side arm U-phase transistors UH and UL, the high side arm and low side arm V-phase transistors VH and VL, and the high side arm and low side arm W-phase transistors WH and WL, the transistor of a high side arm and the transistor of a low side arm are disposed side by side in the first direction D1.

Three element arrays PU1, PV1, and PW1 corresponding to the three phases of the first power conversion circuit portion 31 and three element arrays PU2, PV2, and PW2 corresponding to the three phases of the second power conversion circuit portion 32 are disposed at positions facing each other in a second direction D2 orthogonal to the first direction D1 for each phase. The element array PU1 of the high side arm and low side arm U-phase transistors UH and UL of the first power conversion circuit portion 31 and the element array PU2 of the high side arm and low side arm U-phase transistors UH and UL of the second power conversion circuit portion 32 are disposed opposite to each other in the second direction D2.

The element array PV1 of the high side arm and low side arm V-phase transistors VH and VL of the first power conversion circuit portion 31 and the element array PV2 of the high side arm and low side arm V-phase transistors VH and VL of the second power conversion circuit portion 32 are disposed opposite to each other in the second direction D2. The element array PW1 of the high side arm and low side arm W-phase transistors WH and WL of the first power conversion circuit portion 31 and the element array PW2 of the high side arm and low side arm W-phase transistors WH and WL of the second power conversion circuit portion 32 are disposed opposite to each other in the second direction D2.

Element arrays PS including switching elements of a high side arm and a low side arm of the third power conversion circuit portion 33 are disposed side by side next to the first power conversion circuit portion 31 and the second power conversion circuit portion 32 in the first direction D1. The first transistors S1 of a high side arm of the third power conversion circuit portion 33 are disposed side by side next to the second power conversion circuit portion 32 in the first direction D1. The second transistors S2 of a low side arm of the third power conversion circuit portion 33 are disposed side by side next to the first power conversion circuit portion 31 in the first direction D1. In the third power conversion circuit portion 33, the first transistor S1 of a high side arm and the second transistor S2 of a low side arm forming a pair are disposed opposite to each other in the second direction D2.

As shown in FIG. 2, the power conversion device 1 includes two heat dissipation portions 61 having the power module 21 interposed therebetween from both sides in a thickness direction (third direction) E of the power module 21, a joint 62, and two seal members 63. The two heat dissipation portions 61 corresponds to a first heat dissipation portion 61a and a second heat dissipation portion 61b. The heat dissipation portion 61 includes a heat dissipation case 64 and a heat dissipation plate 65.

The outer shape of the heat dissipation case 64 is formed in, for example, a rectangular box shape. The heat dissipation case 64 includes a refrigerant flow channel 66 through which a refrigerant circulates. The refrigerant flow channel 66 is formed by a plurality of wall portions 67 defining recessed grooves in the inside of the heat dissipation case 64. The refrigerant flow channel 66 is connected to a refrigerant supply port 68a and a refrigerant discharge port 68b which are formed in the heat dissipation case 64 of the first heat dissipation portion 61a.

The refrigerant supply port 68a and the refrigerant discharge port 68b are formed on the ends of the heat dissipation case 64.

For example, the refrigerant supply port 68a and the refrigerant discharge port 68b may be formed on a first end 64a out of a first end 64a and a second end 64b in the first direction D1 of the heat dissipation case 64. The refrigerant supply port 68a and the refrigerant discharge port 68b are formed side by side in the second direction D2 on the first end 64a. The refrigerant supply port 68a and the refrigerant discharge port 68b of the first heat dissipation portion 61a are connected to holes passing through the heat dissipation case 64 in the thickness direction E. The refrigerant supply port 68a and the refrigerant discharge port 68b of the second heat dissipation portion 61b are connected to recessed grooves along which the inside of the heat dissipation case 64 extends in the thickness direction E.

As shown in FIG. 4, the refrigerant flow channel 66 includes a first flow channel 71 and a second flow channel 72 extending in the first direction D1, and a plurality of branching flow channels 73 branching between the first flow channel 71 and the second flow channel 72 and extending in the second direction D2.

The first flow channel 71 extends from the refrigerant supply port 68a of the first end 64a toward the second end 64b in the first direction D1. Specifically, the first flow channel 71 includes a connecting portion 71a connected to the refrigerant supply port 68a and a straight portion 71b extending linearly along the direction (first direction D1) parallel to the branching flow channel 73. The first flow channel 71 is configured such that the cross-sectional area (cross-sectional area orthogonal to a circulation direction) of the connecting portion 71a becomes larger than the cross-sectional area of the straight portion 71b.

The second flow channel 72 extends from the second end 64b toward the refrigerant discharge port 68b of the first end 64a in the first direction D1. Specifically, the second flow channel 72 includes a connecting portion 72a connected to the refrigerant discharge port 68b and a straight portion 72b extending linearly along the direction (first direction D1) parallel to the branching flow channel 73. The second flow channel 72 is configured such that the cross-sectional area of the connecting portion 72a becomes larger than the cross-sectional area of the straight portion 72b.

The plurality of branching flow channels 73 connect the first flow channel 71 and the second flow channel 72. Specifically, the branching flow channel 73 includes three first branching flow channels 73a corresponding to the three phases of the first power conversion circuit portion 31 and the second power conversion circuit portion 32, and one second branching flow channel 73b corresponding to the third power conversion circuit portion 33.

The first branching flow channels 73a are provided at positions overlapping, in a plan view, the element arrays PU1, PV1, and PW1 of the first power conversion circuit portion 31 and the element arrays PU2, PV2, and PW2 of the second power conversion circuit portion 32 which correspond to the respective three phases and face each other in the second direction D2. In each of the three phases, the upstream portion (region on the first flow channel 71 side) of the first branching flow channel 73a overlaps the element arrays PU1, PV1, and PW1 of the first power conversion circuit portion 31 in a plan view. The downstream portion (region on the second flow channel 72 side) of the first branching flow channel 73a overlaps the element arrays PU2, PV2, and PW2 of the second power conversion circuit portion 32 in a plan view.

The first branching flow channel 73a is configured such that the cross-sectional areas of its upstream end (portion connected to the first flow channel 71) and its downstream end (portion connected to the second flow channel 72) become smaller than that of its central portion. Specifically, the upstream end and the downstream end of the first branching flow channel 73a are configured such that their flow channel widths in the first direction D1 become larger than that of its central portion. The central portion of the first branching flow channel 73a overlaps the entirety of the first power conversion circuit portion 31 and the second power conversion circuit portion 32 in a plan view. The upstream end and the downstream end of the first branching flow channel 73a are located outside of the first power conversion circuit portion 31 and the second power conversion circuit portion 32 in the second direction.

The second branching flow channel 73b is provided at a position overlapping, in a plan view, the first transistor S1 of a high side arm and the second transistor S2 of a low side arm which face each other in the second direction D2 in one element array PS of the third power conversion circuit portion 33. The upstream portion (region on the first flow channel 71 side) of the second branching flow channel 73b overlaps the second transistor S2 of a low side arm in a plan view. The downstream portion (region on the second flow channel 72 side) of the second branching flow channel 73b overlaps the first transistor S1 of a high side arm in a plan view. Meanwhile, the shape of the second branching flow channel 73b in a plan view is the same as that of the first branching flow channel 73a. That is, the central portion of the second branching flow channel 73b overlaps the entirety of the third power conversion circuit portion 33 in a plan view. The upstream end and the downstream end of the first branching flow channel 73a are located outside of the third power conversion circuit portion 33 in the second direction.

The above-described cross-sectional area a of the straight portion 71b of the first flow channel 71 is formed to be larger than the cross-sectional area b of the upstream end of the branching flow channel 73. For example, a relation of a≥4b is established.

As shown in FIG. 2, the outer shape of the heat dissipation plate 65 in a plan view is formed in a plate shape having substantially the same size as that of the heat dissipation case 64. The heat dissipation plate 65 is connected to the wall portion 67 of the heat dissipation case 64, and seals the refrigerant flow channel 66 by blocking the opening end of a recessed groove. Two through-holes 65a facing and communicating with the refrigerant supply port 68a and the refrigerant discharge port 68b, respectively, of the heat dissipation case 64 are formed on the end of the heat dissipation plate 65.

A surface facing the side opposite to the heat dissipation case 64 in the heat dissipation plate 65 configures a mounting surface 65A on which the power module 21 is mounted. The heat dissipation plate 65 includes a plurality of fins (not shown) functioning as a heat sink on a surface 65B on the side opposite to the mounting surface 65A in the thickness direction E. The plurality of fins are disposed within each branching flow channel 73 in a state where the heat dissipation plate 65 is assembled in the heat dissipation case 64. For example, the outer shape of the fin is formed in a wave type or a pin type which makes it possible to dispose the fins in a higher density than that with a straight type.

The joint 62 is disposed at a position overlapping the refrigerant supply port 68a and the refrigerant discharge port 68b (through-holes 65a), in a plan view, between the first heat dissipation portion 61a and the second heat dissipation portion 61b.

That is, the joint 62 is disposed next to the power module 21 in the first direction D1. The joint 62 includes a first refrigerant flow channel 62a and a second refrigerant flow channel 62b facing and communicating with the respective through-holes 65a corresponding to the heat dissipation plate 65.

The seal member 63 is disposed between each heat dissipation portion 61 (heat dissipation plate 65) and the joint 62. Through-holes 63a passing through the seal member 63 in the thickness direction E are formed in the seal member 63. The through-holes 63a face and communicate with each of the two through-holes 65a formed in the heat dissipation plate 65 and the two refrigerant flow channels 62a and 62b formed in the joint 62. The seal member 63 seals an interval between the heat dissipation plate 65 and the joint 62 so as to perform sealing by mutually connecting a corresponding through-hole 65a and refrigerant flow channels 62a and 62b out of the through-holes 65a of the heat dissipation plate 65 and the refrigerant flow channels 62a and 62b of the joint 62.

Each cross-sectional area c of the refrigerant supply port 68a and the refrigerant discharge port 68b of the heat dissipation case 64, the through-hole 65a of the heat dissipation plate 65, the refrigerant flow channels 62a and 62b of the joint 62, and the through-hole 63a of the seal member 63 is formed to be larger than the cross-sectional area b of the upstream end of the branching flow channel 73. For example, a relation of c/8≥b is established.

Figure 5:
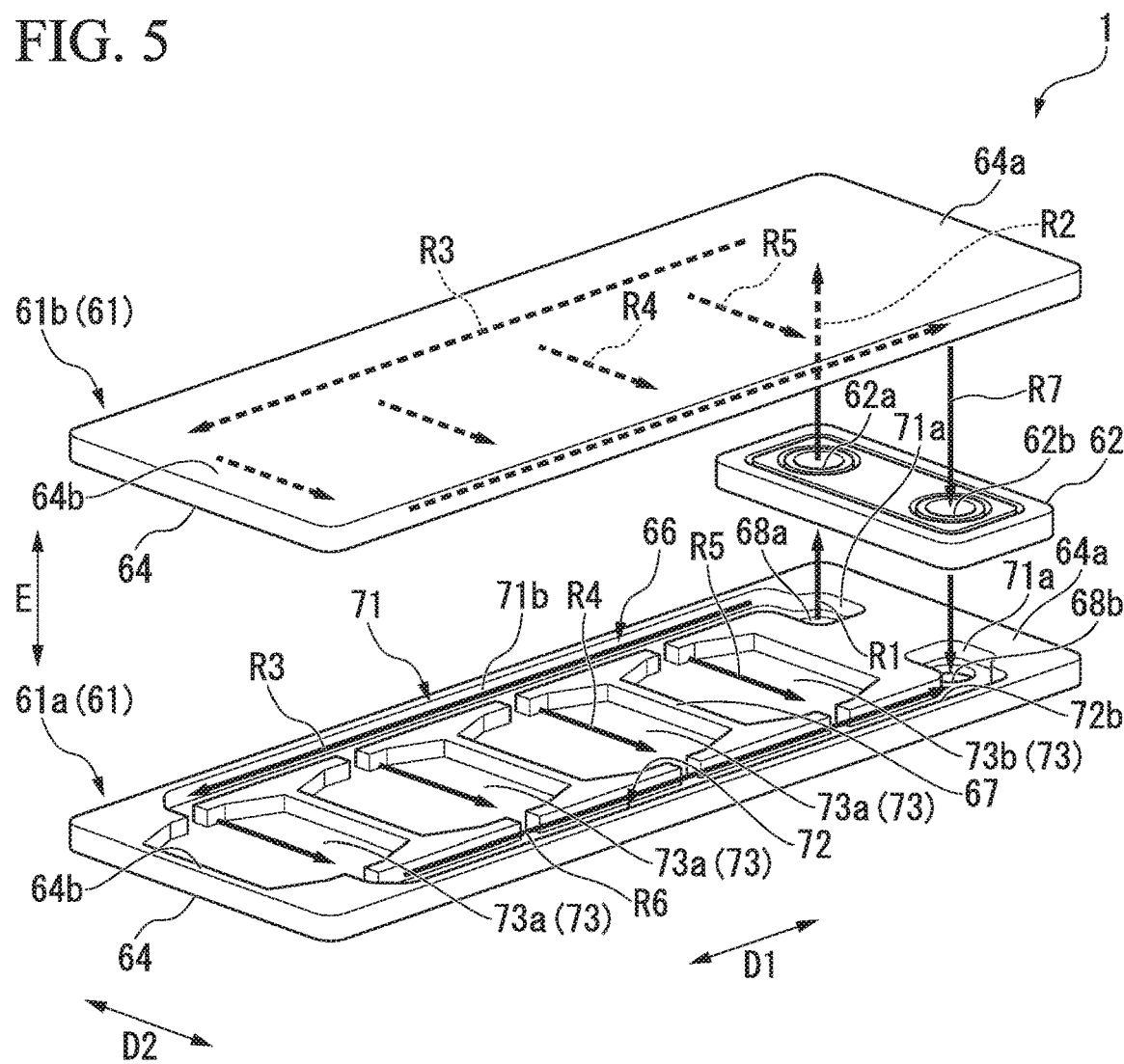
FIG. 5 is an exploded perspective view illustrating each heat dissipation case of the first heat dissipation portion and a second heat dissipation portion and a joint in the power conversion device according to the embodiment of the present invention, and is a diagram illustrating a circulation path of a refrigerant.

FIG. 5 is an exploded perspective view illustrating the heat dissipation case 64 and the joint 62 of each of the first heat dissipation portion 61a and the second heat dissipation portion 61b in the power conversion device 1 according to the embodiment of the present invention, and is a diagram illustrating a circulation path of a refrigerant. Meanwhile, in FIGS. 4 and 5, flows of the refrigerant are shown by arrows.

As shown in FIGS. 4 and 5, a refrigerant which is supplied from the outside to two heat dissipation portions 61 first passes through the refrigerant supply port 68a of the first heat dissipation portion 61a (see arrow R1), and flows in by branching into the refrigerant flow channel 66 of the first heat dissipation portion 61a and the first refrigerant flow channel 62a of the joint 62. The refrigerant flowing through the first refrigerant flow channel 62a of the joint 62 passes through the refrigerant supply port 68a of the second heat dissipation portion 61b, and flows into the refrigerant flow channel 66 of the second heat dissipation portion 61b (see arrow R2).

In the refrigerant flow channel 66 of each of the first heat dissipation portion 61a and the second heat dissipation portion 61b, the refrigerant flows in by branching into the plurality of branching flow channels 73 while flowing through the first flow channel 71 from the first end 64a toward the second end 64b in the first direction D1 (see arrow R3). The refrigerant flowing through the plurality of branching flow channels 73 from the first flow channel 71 toward the second flow channel 72 in the second direction D2 cools a plurality of element arrays PU1, PV1, PW1, PU2, PV2, PW2, and PS of the power module 21. Specifically, the refrigerant flowing through the first branching flow channel 73a first cools the element arrays PU1, PV1, and PW1 of the first power conversion circuit portion 31, and next cools the element arrays PU2, PV2, and PW2 of the second power conversion circuit portion 32 (see arrow R4). The refrigerant flowing through the second branching flow channel 73b first cools the second transistor S2 of a low side arm in the element array PS of the third power conversion circuit portion 33, and next cools the first transistor S1 of a high side arm (see arrow R5).

The refrigerant having passed through the branching flow channel 73 flows into the second flow channel 72. The refrigerant flows through the second flow channel 72 from the second end 64b toward the first end 64a, and flows into the refrigerant discharge port 68b (see arrow R6). The refrigerant flowing through the refrigerant discharge port 68b of the second heat dissipation portion 61b passes through the second refrigerant flow channel 62b of the joint 62, and flows into the refrigerant discharge port 68b of the first heat dissipation portion 61a (see arrow R7). The refrigerant passing through the refrigerant discharge port 68b of the first heat dissipation portion 61a is discharged from the two heat dissipation portions 61 to the outside.

In the power conversion device 1 of the present embodiment, the element arrays PU1, PV1, PW1, PU2, PV2, and PW2 of the first power conversion circuit portion 31 and the second power conversion circuit portion 32 are configured to overlap the first branching flow channels 73a branched from the first flow channel 71 in a plan view.

According to this configuration, as compared with a case where a plurality of power conversion circuit portions are disposed on a refrigerant flow channel of one system, it is possible to suppress an increase in the temperature gradient of a refrigerant between the upstream side and the downstream side of the refrigerant flow channel associated with an increase in the number of power conversion circuit portions. That is, the number of branching flow channels 73 or the cross-sectional areas thereof are adjusted in accordance with the number of power conversion circuit portions, the amount of heat generation, or the like, and thus it is possible to uniformly and efficiently cool the element arrays PU1, PV1, PW1, PU2, PV2, PW2, and PS of the power conversion circuit portions 31 to 33 which are disposed on the branching flow channel 73. Further, it is possible to prevent the flow channel length of one branching flow channel 73 from increasing, and to suppress an increase in a loss of pressure of the refrigerant. In each of the first motor 12 and the second motor 13, since the first branching flow channel 73a is provided corresponding to each phase, it is possible to suppress a change in cooling performance among a plurality of phases of each of the motors 12 and 13, and to make cooling performance between a plurality of phases uniform.

Figure 6:
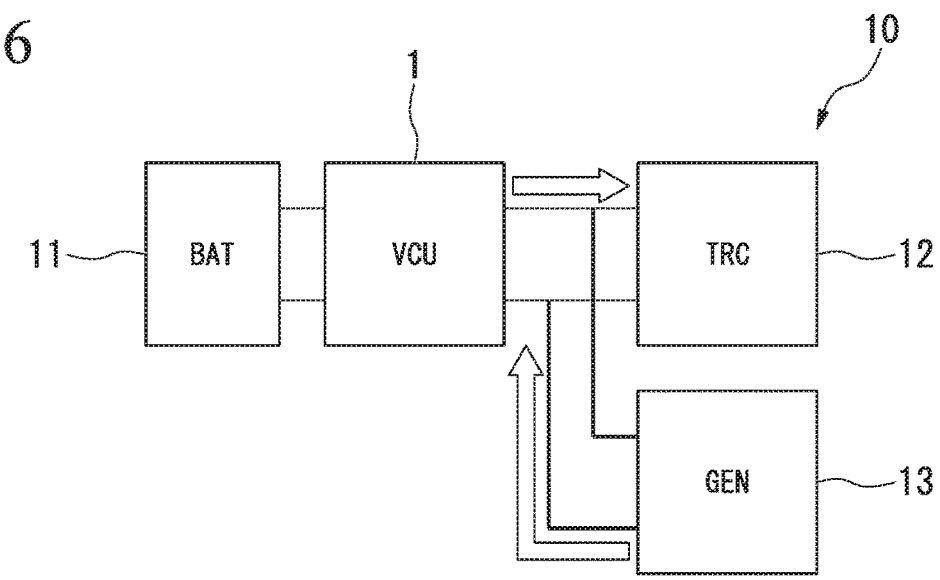
FIG. 6 is a diagram illustrating a configuration of a portion of the vehicle in which the power conversion device according to the embodiment of the present invention is mounted.
Figure 7:
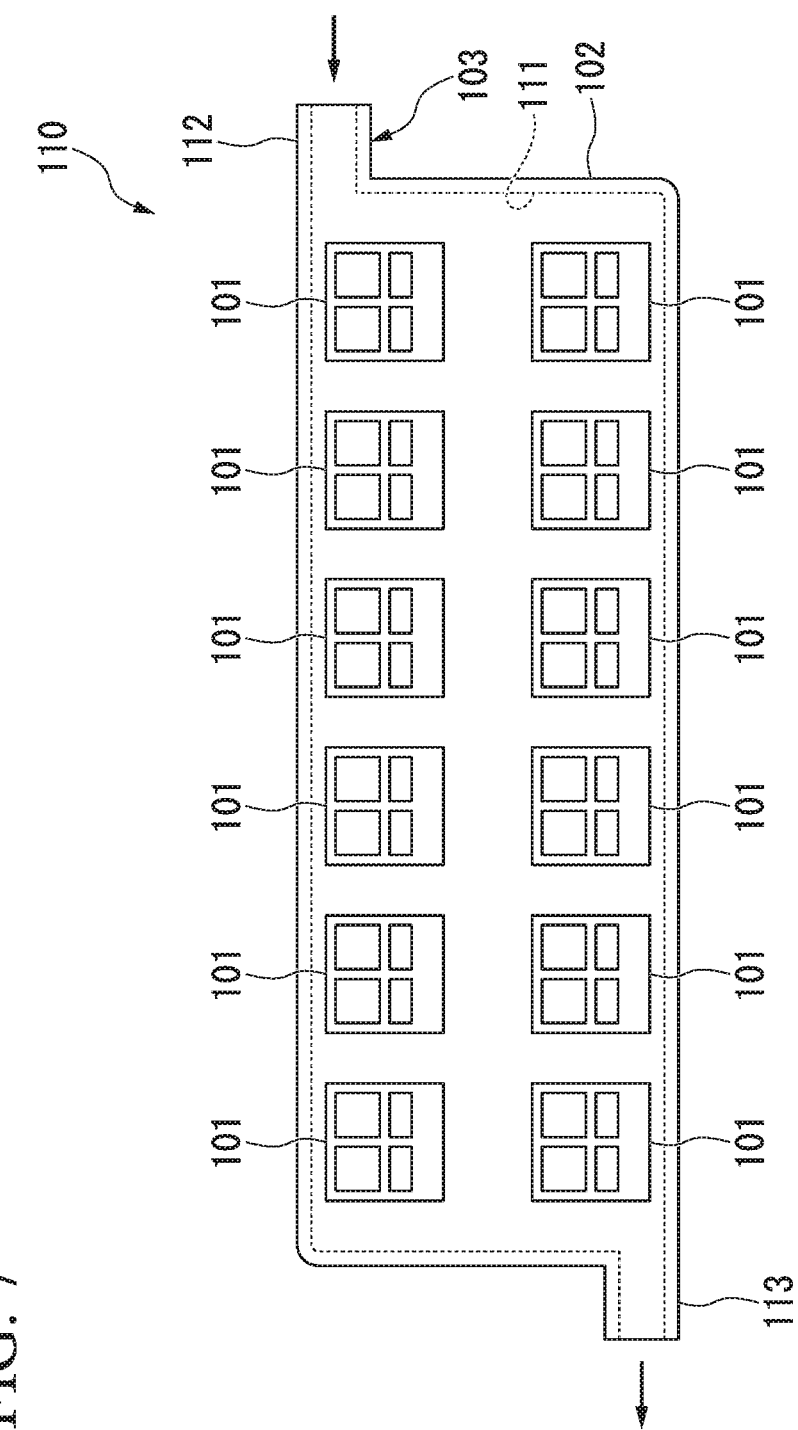
FIG. 7 is a plan view of a semiconductor device according to the related art.

FIG. 6 is a diagram illustrating a configuration of a portion of the vehicle 10 in which the power conversion device 1 according to the embodiment is mounted.

Here, as shown in FIG. 6, power boosted in the power conversion device 1 and power generated in the second motor 13 are output to the first motor 12. Therefore, as shown in FIG. 4, the element arrays PU1, PV1, and PW1 (see FIG. 1 or the like) of the first power conversion circuit portion 31 corresponding to the first motor 12 have more of a tendency to generate heat than the element arrays PU2, PV2, and PW2 of the second power conversion circuit portion 32 corresponding to the second motor 13. Therefore, in each of the first branching flow channels 73a, the element arrays PU1, PV1, and PW1 of the first power conversion circuit portion 31 are disposed further upstream than the element arrays PU2, PV2, and PW2 of the second power conversion circuit portion 32, and thus it is possible to secure a difference in temperature between the refrigerant and the first power conversion circuit portion 31. As a result, it is possible to efficiently cool the first power conversion circuit portion 31.

Thereby, it is possible to uniformly and efficiently cool the element arrays PU1, PV1, PW1, PU2, PV2, and PW2 of the first power conversion circuit portion 31 and the second power conversion circuit portion 32, and to suppress an increase in a difference in cooling performance between a plurality of element arrays PU1, PV1, PW1, PU2, PV2, and PW2.

Thereby, in predetermined cooling performance such as, for example, radiation performance of a radiator which is relevant to the pump capacity of the refrigerant and the temperature of the refrigerant, it is possible to uniformly and efficiently cool the plurality of element arrays PU1, PV1, PW1, PU2, PV2, and PW2 of the first power conversion circuit portion 31 and the second power conversion circuit portion 32.

In the present embodiment, in the element arrays PU1, PV1, PW1, PU2, PV2, and PW2 of the first power conversion circuit portion 31 and the second power conversion circuit portion 32 in the respective first branching flow channels 73a, the high side arm switching element and the low side arm switching element are disposed side by side in the first direction D1. Thereby, it is possible to suppress an increase in a difference in cooling performance between the high side arm switching element and the low side arm switching element.

In the present embodiment, during a boost in voltage of the third power conversion circuit portion 33, heat generation due to the second transistor S2 of a low side arm becomes larger than that of the first transistor S1 of a high side arm. In addition, during the regeneration of the third power conversion circuit portion 33, heat generation due to the first transistor S1 of a high side arm becomes larger than that of the second transistor S2 of a low side arm. However, in a case where the output allowable current or the output allowable power of the battery 11 is larger than the input allowable current or the input allowable power of the battery when voltage boost and regeneration are compared with each other, heat generation due to the second transistor S2 of a low side arm becomes larger than that of the first transistor S1 of a high side arm.

Consequently, in the present embodiment, in the second branching flow channel 73b, the second transistor S2 of a low side arm is disposed on the upstream side of the first transistor S1 of a high side arm.

Therefore, it is possible to secure a difference in temperature between the refrigerant and the second transistor S2 of a low side arm. As a result, it is possible to efficiently cool the second transistor S2 of a low side arm. Thereby, it is possible to uniformly and efficiently cool the first transistor S1 of a high side arm and the second transistor S2 of a low side arm of the third power conversion circuit portion 33, and to suppress an increase in a difference in cooling performance between the first transistor S1 and the second transistor S2.

Hereinafter, a modification example of the embodiment will be described.

In the above-described embodiment, the power conversion device 1 is assumed to include two heat dissipation portions 61 having the power module 21 interposed therebetween from both sides in the thickness direction E, but there is no limitation thereto. The power conversion device 1 may include one heat dissipation portion 61 in which the power module 21 is mounted.

Meanwhile, in the above-described embodiment, the power conversion device 1 is assumed to be mounted in the vehicle 10, but may be mounted in other instruments without being limited thereto.

The embodiments of the present invention have been presented by way of example only, and are not intended to limit the scope of the invention. Indeed, these embodiments described herein may be embodied in a variety of other forms; furthermore, various omissions, substitutions and changes in the form of the embodiments described herein may be made without departing from the spirit of the inventions. The appended claims and their equivalents are intended to cover such forms or modifications as would fall within the scope and spirit of the invention.

What is claimed is:

1. A power conversion device comprising:
   two heat dissipation portions each having a refrigerant flow channel through which a refrigerant circulates and a mounting surface;
   a plurality of element arrays each including a high side arm element and a low side arm element and provided between the two heat dissipation portions which are disposed opposite to each other;
   a plurality of first element arrays in which the plurality of element arrays delivering power to and/or from a first motor capable of a power-running operation using power supplied from a power storage device are disposed side by side in a first direction on the mounting surface according to a plurality of phases of the first motor; and
   a plurality of second element arrays in which the plurality of element arrays delivering power to and/or from a second motor capable of generating power for running of the first motor are disposed side by side in the first direction on the mounting surface according to a plurality of phases of the second motor,
   wherein the plurality of first element arrays and the plurality of second element arrays are disposed at positions facing each other in a second direction intersecting the first direction,
   wherein the refrigerant flow channel includes
      a refrigerant supply port passing through in a third direction orthogonal to the first direction and the second direction,
      a first flow channel extending in the first direction from the refrigerant supply port, and
      a plurality of first branching flow channels that branch from the first flow channel so as to correspond to each phase of the plurality of first element arrays and the plurality of second element arrays, and extend in the second direction at positions overlapping the first element arrays and the second element arrays in a plan view seen from the third direction,
   wherein, in each of the first branching flow channels, the plurality of first element arrays are located on an upstream side of the first branching flow channel in the second direction with respect to the plurality of second element arrays, and
   wherein the refrigerant supply port provided in one of the two heat dissipation portions and the refrigerant supply port provided in the other of the two heat dissipation portions are connected at a position overlapping each other in the third direction.

2. The power conversion device according to claim 1, wherein the high side arm element and the low side arm element in the plurality of first element arrays and the plurality of second element arrays are disposed side by side in the first direction.

3. The power conversion device according to claim 1, further comprising a voltage converter which is electrically connected to the plurality of first element arrays or the plurality of second element arrays,
   wherein a high side arm element and a low side arm element configuring the voltage converter are disposed side by side in the second direction on the mounting surface,
   the refrigerant flow channel further includes a second branching flow channel that branches from the first flow channel, and extends in the second direction at a position overlapping the high side arm element and the low side arm element of the voltage converter in the plan view, and the low side arm element of the voltage converter is located on an upstream side of the second branching flow channel in the second direction with respect to the high side arm element of the voltage converter.

4. The power conversion device according to claim 1, wherein the refrigerant flow channel includes a refrigerant discharge port connected to the first branching flow channel and passing through in the third direction, and the refrigerant discharge port provided in one of the two heat dissipation portions and the refrigerant discharge port provided in the other of the two heat dissipation portions are connected at a position overlapping each other in the third direction.

5. The power conversion device according to claim 1, wherein the refrigerant supply port and a refrigerant discharge port are formed side by side in the second direction.

6. The power conversion device according to claim 1, wherein the refrigerant supply port and a refrigerant discharge port are connected to each other via a joint.

* * * * *